(12) United States Patent
Ikeda et al.

(10) Patent No.: US 7,381,065 B2
(45) Date of Patent: Jun. 3, 2008

(54) HIGH-TENSION CONNECTOR BOX

(75) Inventors: Tomohiro Ikeda, Shizuoka (JP);
Yoshiaki Ichikawa, Shizuoka (JP);
Shigeki Matsumoto, Shizuoka (JP); Ko Watanabe, Aichi (JP); Takenori Tsuchiya, Aichi (JP)

(73) Assignees: Yazaki Corporation, Tokyo (JP);
Toyota Jidosha Kabushiki Kaisha, Toyota-shi (JP)

( * ) Notice: Subject to any disclaimer, the term of this patent is extended or adjusted under 35 U.S.C. 154(b) by 275 days.

(21) Appl. No.: 11/195,865

(22) Filed: Aug. 3, 2005

(65) Prior Publication Data

US 2006/0036362 A1 Feb. 16, 2006

(30) Foreign Application Priority Data

Aug. 4, 2004 (JP) .............................. 2004-227836

(51) Int. Cl.
*H01R 12/00* (2006.01)
(52) U.S. Cl. ...................................................... 439/76.2
(58) Field of Classification Search ............... 439/76.2, 439/76.1, 949, 55, 66
See application file for complete search history.

(56) References Cited

U.S. PATENT DOCUMENTS 5,643,693 A * 7/1997 Hill et al. .................... 429/121
5,995,380 A * 11/1999 Maue et al. ................. 361/826
6,015,302 A * 1/2000 Butts et al. ................. 439/76.2
6,524,134 B2 * 2/2003 Flickinger et al. .......... 439/607
6,835,073 B2 * 12/2004 Kobayashi ................. 439/76.2
6,932,625 B2 * 8/2005 Yagi et al. ................. 439/76.2
6,989,976 B2 * 1/2006 Ashiya ......................... 361/27
2003/0123205 A1 * 7/2003 Ashiya ...................... 361/93.1

FOREIGN PATENT DOCUMENTS

| JP | 11-069568 | 3/1999 |
| JP | 2002-58132 | 2/2002 |
| JP | 2003-87933 | 3/2003 |

* cited by examiner

*Primary Examiner*—Neil Abrams
*Assistant Examiner*—Phuongchi Nguyen
(74) *Attorney, Agent, or Firm*—Kratz, Quintos & Hanson, LLP

(57) ABSTRACT

Preventing a controller securely from effects of heat or noise of a relay and a high-tension circuit, a synthetic resin inner cover is arranged between a top cover and a bottom cover. A high-tension circuit is arranged between the top cover and inner cover. A control baseboard is provided at the bottom cover. The bottom cover is covered by the inner cover. Thereby, the control baseboard is prevented from being heated by the high-tension circuit by the inner cover. A conductive metallic shielding cover is arranged between the bottom cover having the control baseboard and the inner cover to cover the bottom cover including the control baseboard. Thereby, the control baseboard is prevented from noise of the high-tension circuit. The inner cover and the shielding cover having respectively a flange are fixed on a vehicle body by a bolt to overlap the both flanges.

16 Claims, 4 Drawing Sheets

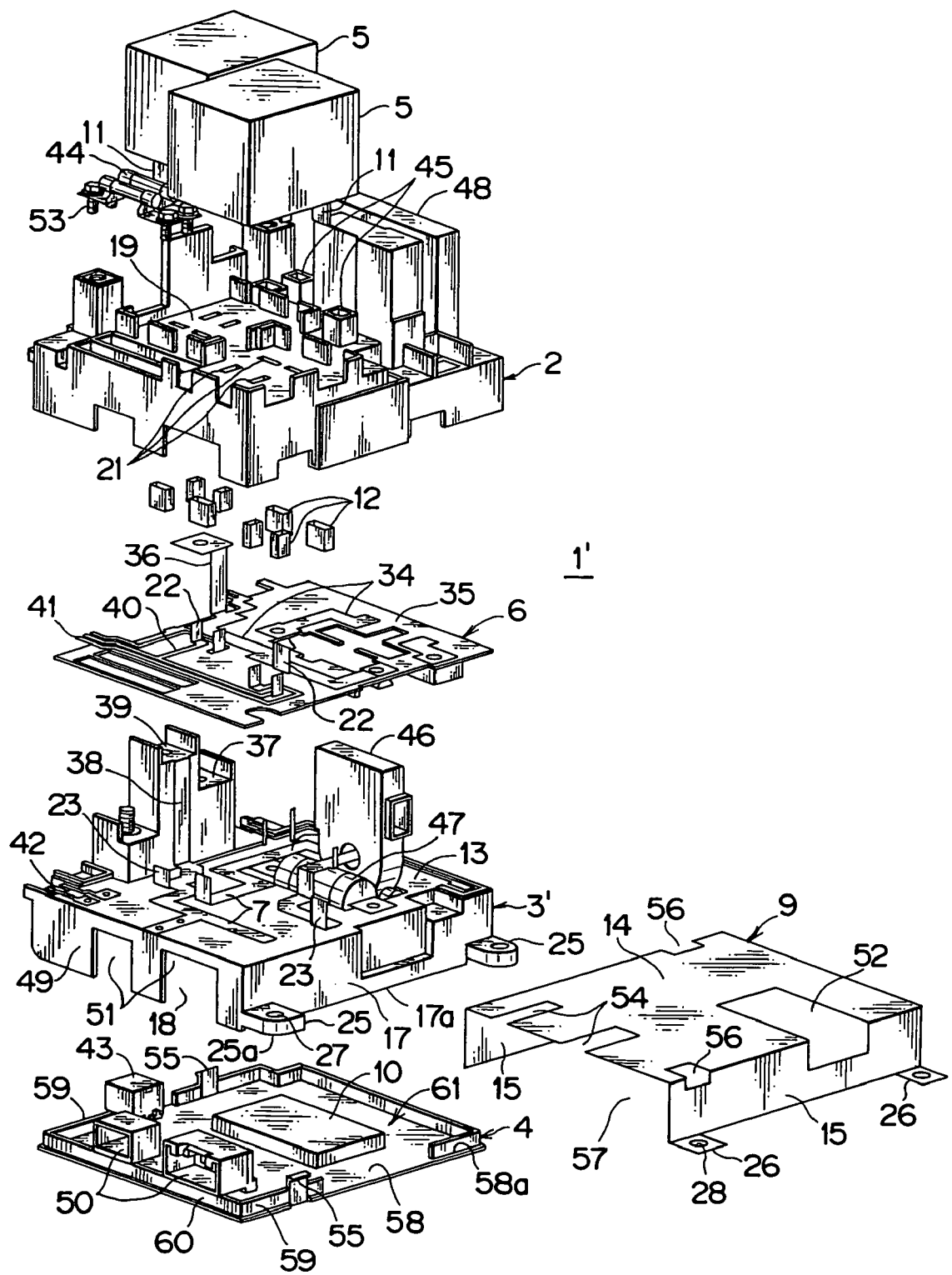
F I G. 3

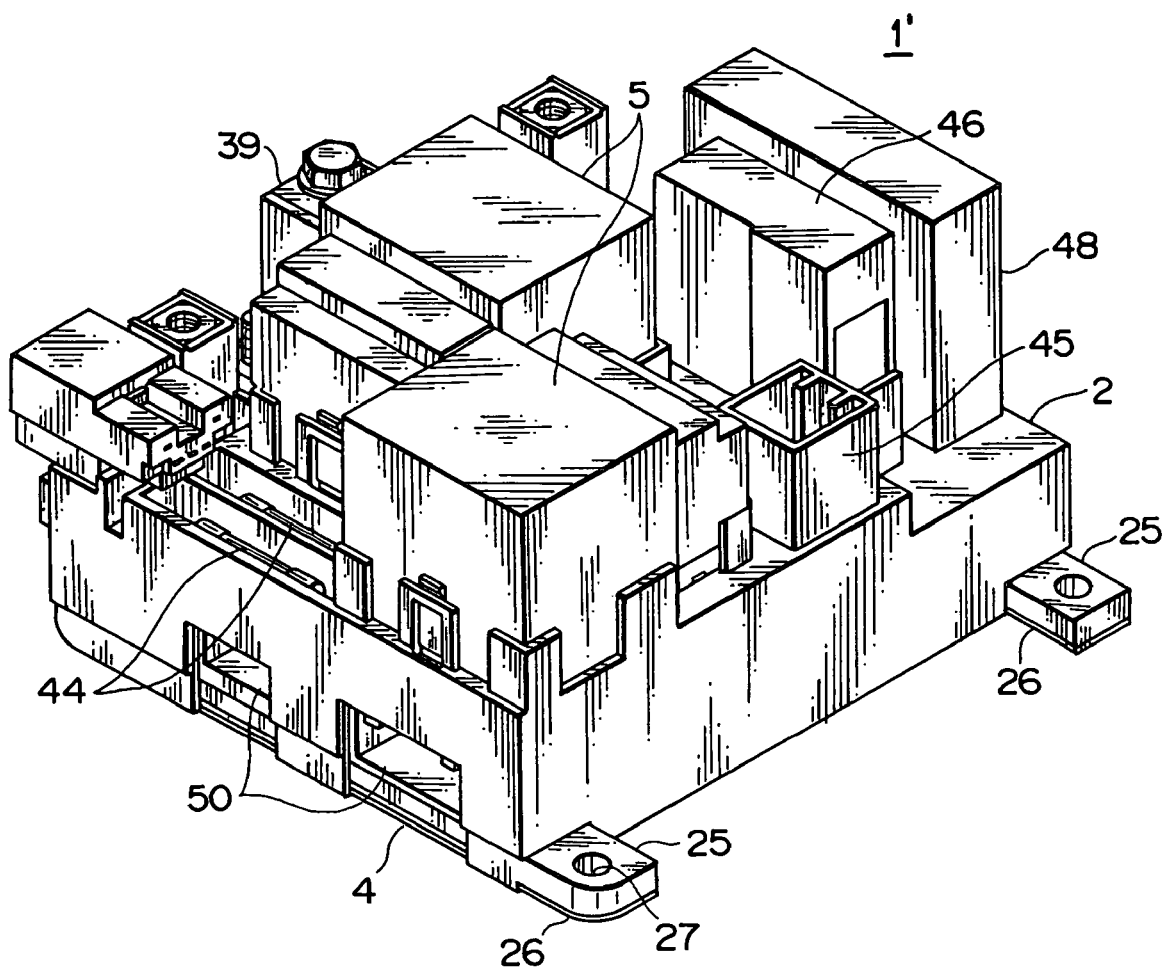
F I G. 4

HIGH-TENSION CONNECTOR BOX

The priority application Number Japan Patent Application No. 2004-227836 upon which this patent application is based is hereby incorporated by reference.

BACKGROUND OF THE INVENTION

1. Field of the Invention

This invention relates to a high-tension connector box for connecting a high-tension, high-current circuit of an electric vehicle with an electric component like a relay and having a controller inside thereof.

2. Description of the Related Art

FIG. 5 shows one example of a usual electric connecting box (refer Patent Reference 1).

The electric connecting box 70 includes a top cover 71 and a bottom cover 72 those are made of synthetic resin, a relay and a fuse those are mounted on the top cover 71, a bus-bar circuit board 73, a flexible circuit board 74 and a printed circuit board 75 those are arranged between the top cover 71 and the bottom cover 72.

The top cover 71 is provided with a relay mount portion 76, a fuse mount portion 77 and a connector mount portion 78. The bus-bar circuit 73 is arranged on a lower side of the top cover 71. Tab terminals 79 of a bus bar of the bus-bar circuit board 73 are projectingly provided vertically within the relay mount portion 76, the connector mount portion 78 and a connector mount portion 80 of the bottom cover 72. The tab terminals 79 are connected with the flexible circuit board 74 and the printed circuit board 75 at the lower side thereof. A terminal end of the flexible circuit board 74 is located in a connector mount portion 81 of the bottom cover 72. The bottom cover 72 is provided inside thereof with a large space 82.

FIG. 6 shows the other example of the usual electric connecting box (refer Patent Reference 2).

An electric connecting box 83 includes a high-current distribution circuit board 86 between a top cover 84 and a bottom cover 85, and low-current printed circuit board 88 clamping an insulation board 87 under the high-current distribution circuit board 86. The distribution circuit board 86 and the printed circuit board 88 are connected with each other by a jumper wire 89. A relay 90 and a fuse 91 are mounted on an upper side of the distribution circuit board 86.

On the printed circuit board 88, electronic components, such as a micro-computer 92, a resistor 93 and a capacitor 94, are mounted, and the micro-computer 92 is covered by a metallic cover 95 for electro-magnetic shield.

Reference Patent 1 is Japan Patent Application Laid Open No. 2002-58132.

Reference Patent 2 is Japan Patent Application Laid Open No. 2003-87933.

SUMMARY OF THE INVENTION

Objects to be Solved

According to the usual electric connecting box 70 in FIG. 5, when an electronic control board is provided within the space 82 of the bottom cover 72 and the electric connecting box 70 is used for high-tension, a control board (the controller) would malfunction by heat and noise of a point of the relay and a high-tension circuit on the upper side thereof.

According to the usual electric connecting box 83 in FIG. 6, the micro-computer 92 as the controller of the printed board 88 would be affected by noise of the relay 90 and the current distribution circuit board 86 on the upper side thereof from a side of the insulation board 87, not from an outside of the metallic cover 95.

To overcome the above problem, an object of this invention are to provide a high-tension connector box, which can prevent a controller securely from effects of heat and noise of the relay and the high-tension circuit.

How To Attain the Object of the Present Invention

In order to attain the object of the present invention, a high-tension connector box includes according to an aspect of the present invention is specified in that an inner cover is provided between a top cover and a bottom cover, and electric components are mounted on the top cover, and a high-tension circuit is provided between the top cover and the inner cover, and a control baseboard is provided at the bottom cover, and the inner cover covers the bottom cover, and the control baseboard is prevented by the inner cover from being heated by the electric circuit and the high-tension circuit.

According to the above structure, the bottom cover with the control baseboard is covered by the inner cover made of synthetic resin, and the high-tension circuit is arranged on the inner cover, and the top cover is arranged above the high-tension circuit, electrical components, such as a relay, are provided on the top cover. Thereby, heat of a contact point of the relay and heat of the high-tension circuit are insulated by the inner cover made of synthetic resin with low heat conductivity, so that it is difficult that the heat is transferred to the control baseboard at the lower side of the inner cover. Since a lower side of the control baseboard is covered by the bottom cover made of synthetic resin, heat of a vehicle body under the bottom cover is insulated by the bottom cover and prevented from transferring to the control baseboard. Thus, heating the control baseboard is prevented and the control baseboard can always act normal function. Also, by covering the control baseboard doubly with the top cover and the inner cover, the control baseboard is securely prevented from penetration of water and dust to inside thereof from outside.

The high-tension connector box according to a second aspect of the invention is specified in the connector box mentioned above by that a space for receiving a junction terminal for connecting the electric components with the high-tension circuit is provided between the top cover and the high-tension circuit.

According to the above structure, the space for receiving the junction terminal increases a distance between the electric components and the inner cover and the space acts as a heat insulator. Thereby, heat transferring from the electric components to the control baseboard inside the inner cover is not easily acted. Terminals of the electric components are connected through the junction terminals with terminals of the high-tension circuit. When the electric component is a relay, the terminals of the high-tension circuit are continued to an open/close circuit of the contact points, and a magnetic excitation circuit is connected with a low-voltage circuit.

The high-tension connector box according to the third aspect of the invention is specified in the high-tension connector box mentioned above by that a conductive metal shielding cover is provided between the bottom cover and the inner cover, and the bottom cover is covered with the bottom cover is covered by the shielding cover. Thereby, the control baseboard on the bottom cover is prevented from noise of the electric components and the high-tension circuit.

According to the above structure, the control circuit and the bottom cover are covered by the shielding cover, and the shielding cover is covered by the inner cover, and the high-tension circuit is arranged above the inner cover, and the inner cover and the high-tension circuit are covered by the top cover, the electric components are provided above the top cover. Noise of opening and closing the contact point of the relay is insulated by the shielding cover so as to prevent the noise from transferring to the control baseboard. The shielding cover covers not only a control portion (ECU) but also whole of the control baseboard, so that the control portion and control circuit are shielded together to be securely electromagnetic shielded. The control baseboard is covered doubly with the inner cover and the shielding cover, so that heat transferring from the electric components and high-tension circuit to the control baseboard is securely prevented.

The high-tension connector box according to a forth aspect of the invention is specified in the connecting box mentioned above by that a bus-bar circuit including the high-tension circuit covers an upper side of the inner cover.

According to the above structure, the insulation board made of synthetic resin of the bus-bar circuit completely isolates the bus bar as the electric components or the high-tension circuit from the control baseboard. Thereby, transferring heat or noise of the electric components and the high-tension circuit to the control baseboard is prevented.

The high-tension connector box according to a fifth aspect of the invention is specified in the connecting box mentioned above by that the inner cover and the shielding cover respectively include a flange, and are fixed simultaneously on to a vehicle body with a bolt by overlapping the flanges.

According to the above structure, the shielding cover is connected electrically with the vehicle body, and noise absorbed in the shielding cover flows through the vehicle body to the earth. The flange of the inner cover and the flange of the shielding cover are fastened simultaneously with the same bolt so as to fix the inner cover and the shielding cover to each other.

The above and other objects and features of this invention will become more apparent from the following description taken in conjunction with the accompanying drawings.

BRIEF DESCRIPTION OF THE DRAWINGS

FIG. 3 is an exploded perspective view of the high-tension connector box;

FIG. 4 is a perspective view of the assembled high-tension connector box;

DESCRIPTION OF THE PREFERRED EMBODIMENT

Figure 1:
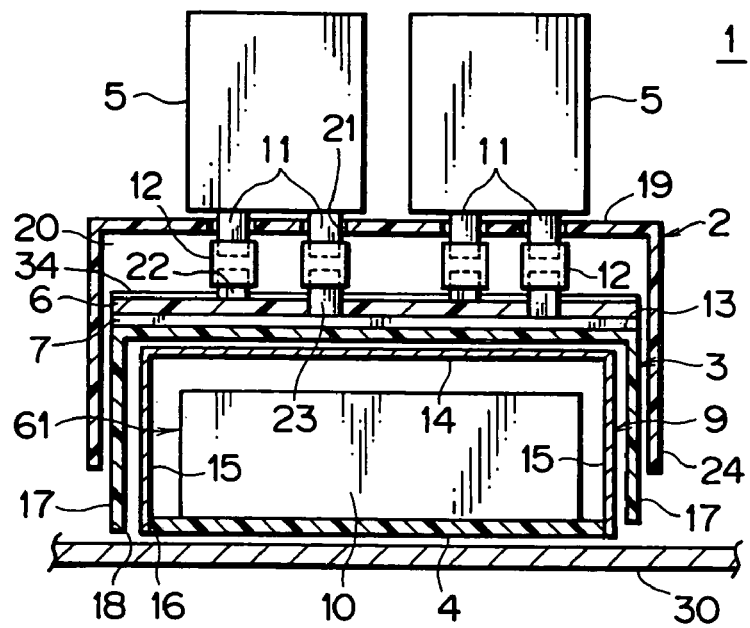
FIG. 1 is a vertical sectional view of an embodiment of a high-tension connector box according to the present invention.

FIG. 1 shows an embodiment of a high-tension connector box according to the present invention.

A high-tension connector box 1 includes a top cover 2, an inner cover 3 and a bottom cover 4 those are made of synthetic resin, a relay 5 (electric components) mounted above the top cover 2, a high-tension circuits 7, 34 arranged between the top cover 2 and the bottom cover 4, a conductive metallic shielding cover 9 provided inside the inner cover 3, and a controller 10 provided on the bottom cover 4, inside of the shielding cover 9.

The high-tension connector box 1 is mounted on the vehicle body, made of metallic material, of an electric vehicle. Respective relays 5 are connected at each electrode terminal 11 thereof with circuits of a battery, an inverter and a magnetic exciter. One relay 5 is for a positive pole and the other relay 5 is for a negative pole.

Each terminal 11 of the relay 5 is connected through a junction terminal 12 respectively with a terminal of bus bar of a bus-bar circuit board 6 thereunder and the bus bar 7 under the bus-bar circuit board 6. A bus bar 34 on an upper side of the bus-bar circuit board 6 and the bus bar 7 on a lower side of the bus-bar circuit board 6 form the high-tension circuit. The bus bar 7 on the lower side is wired on a top wall 13 of the inner cover 3. The bus-bar circuit board 6 is structured with the insulating board made of synthetic resin and the bus bar 34 wired on a top surface of the insulating board. The insulating board is called as an inner plate. Each bus bar is connected through a terminal block or a connector (not shown) with the external battery and a circuit at an inverter side.

A circuit board (not shown) with a printed circuit is arranged on the bottom cover 4, and connected with a controller 10 such as the ECU. A circuit board (not shown) on the bottom cover 4 as a board case and the controller 10 form a control baseboard 61. The control baseboard 61 is provided with a connector (not shown) to be connected with a connector of a wire harness as an external circuit. The bottom cover 4 is fixed on the shielding cover 9 at outside. The bottom cover 4 as the case of the baseboard can be made of synthetic resin also a metallic material such as an iron plate.

The shielding cover 9 is formed smaller than the inner cover 3. The shielding cover 9 is made by folding the iron plate into a U-shape. The shielding cover 9 can be made of not only an iron but also a conductive metal such as copper and aluminum. The shielding cover includes a horizontal wall 14 at the upper side thereof, right/left vertical walls 15 perpendicular to the wall 14, and an opening 16 at the lower side thereof. The shielding cover 9 can be formed with 5 walls at the upper, right/left and front/rear sides. In this specification, directions of front/rear and right/left are defined for convenience on explanation, and are not necessarily to correspond to actual directions in use of the high-tension connector box.

The inner cover 3 includes a horizontal wall 13 at the upper thereof, right/left vertical walls 17 and front/rear vertical walls (not shown), and an opening 18 at the lower thereof. The shielding cover 9 is arranged to have a small gap between an inner wall of the inner cover 3. Outer wall of the shielding cover 9 is allowed to contact with the inner wall of the inner cover 3.

The shielding cover 9 is fixed on the bottom cover 4, and the bottom cover 4 is fixed on the inner cover 3, and the inner cover 3 is fixed on the top cover 2. The bus-bar circuit board 6 and the bus bar 7 are stacked and fixed on the top wall 13 of the inner cover 3.

A space for arranging female-female junction terminal 12 is formed between the bus-bar circuit board 6 and a top wall 19 of the top cover 2. The terminal 11 of the relay 5 is connected through a hole 21 of the top wall 19 of the top cover 2 including an upper-half female electric contact of the junction terminal 12 thereunder. Upward terminals 22, 23 of each bus bar are connected with lower-half female electric contacts of the junction terminals 12. Both vertical side walls 24 of the top cover 2 are arranged along outer surfaces of the both side walls 17 of the inner cover 3.

Bottom ends of the both side walls 17, 15 of the inner cover 3 and the shielding cover 9 are located at substantially same height as bottom end of the bottom cover 4. The inner cover 3 and the shielding cover 9 cover a circuit baseboard (not shown) and the control baseboard 61 including the controller 10 on the bottom cover 4 completely about the upper and the both sides in minimum.

Since the inner cover 3 made of synthetic resin is arranged between the relay 5 and the control baseboard 61 including the controller 10, and between the high-tension circuits 7, 34 and the control baseboard 61, heat at the contact point of the relay 5 and at bus bar as the high-tension circuits 7, 34 is insulated by the top wall 13 and side walls 17 of the inner cover 3. Thereby, the heat is not easily transferred to the control baseboard 61, so that heating the control baseboard 61 is prevented and malfunction of the controller 10 is eliminated.

Since the shielding cover 9 is provided between the high-tension circuit 7, 34 and the control baseboard 61 including the controller 10, the noise generated at the relay 5 and the high-tension circuit 7, 34 is absorbed in the shielding cover 9 and not transferred to the control baseboard 61. Thereby, malfunction of the controller 10 by noise is eliminated.

The high-tension connector box 1 is preferably fixed on a metallic battery case of the vehicle body with a fixing member and the shielding cover 9 is grounded simultaneously. A structure will be described as follows.

Figure 2:
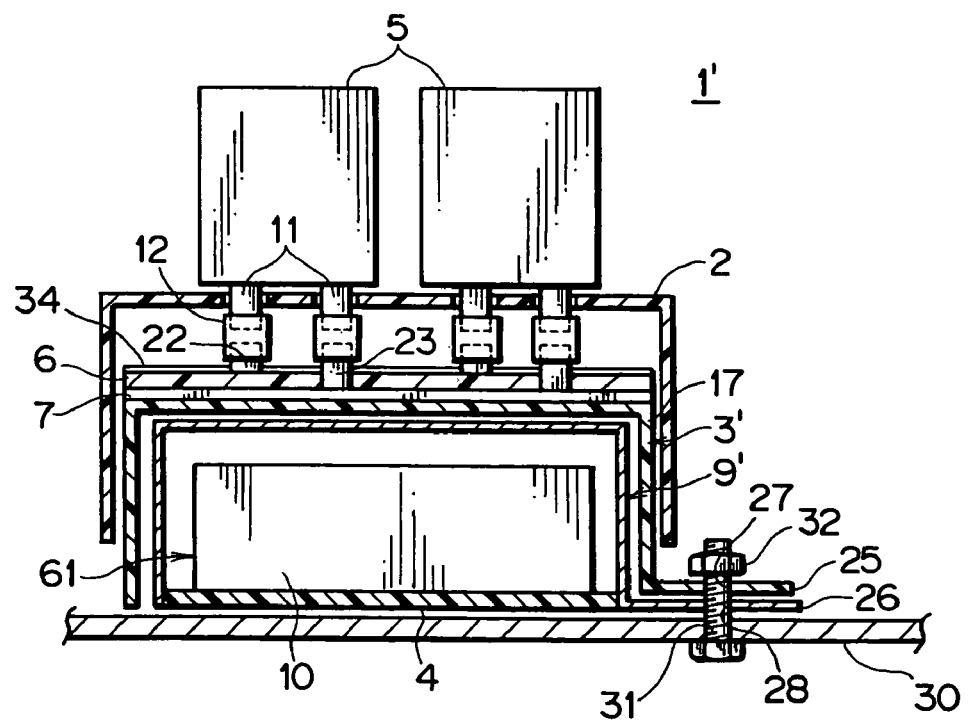
FIG. 2 is a vertical sectional view of an embodiment of fixing structure of the high-tension connector box.
Figure 5:
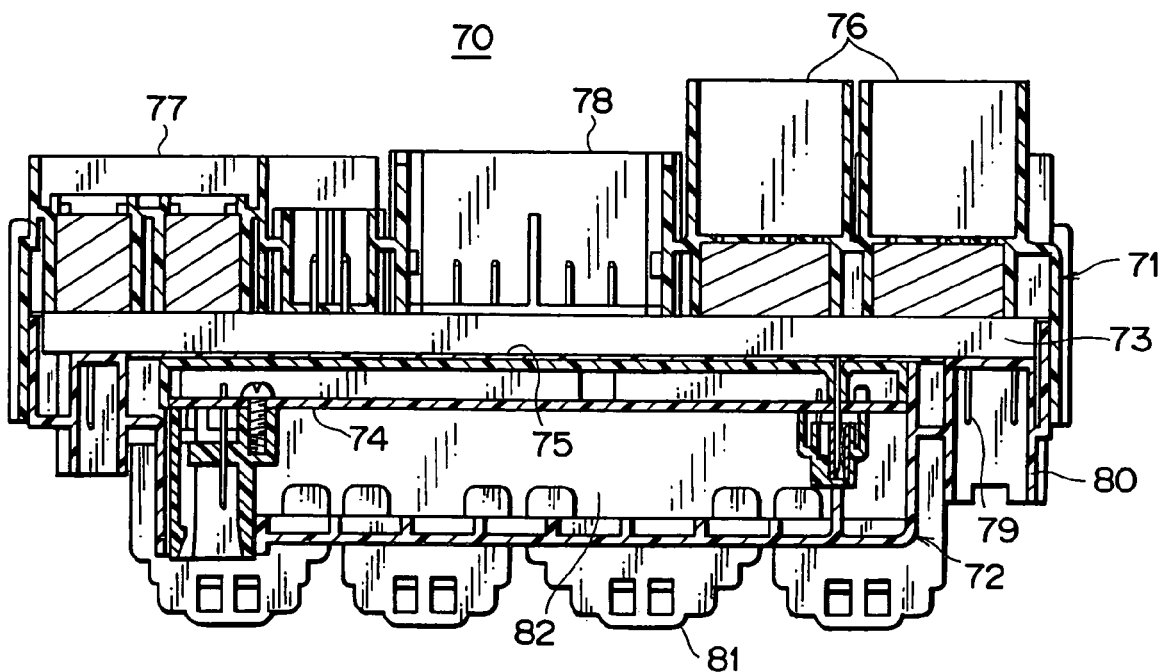
FIG. 5 is a vertical sectional view of one example of an electric connecting box by prior art.
Figure 6:
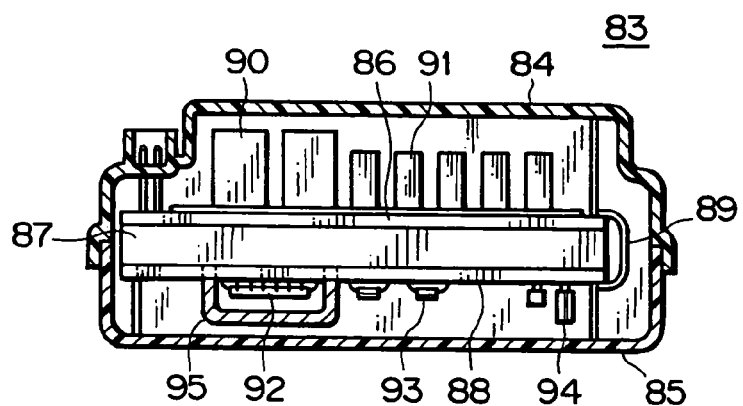
FIG. 6 is a vertical sectional view of another example of the electric connecting box by prior art.

FIG. 2 shows one embodiment of a fixing structure for fixing the high-tension connector box. All parts other than the fixing structure is the same as that in FIG. 1. Thereby, all parts are marked with the same marking and detail explanation is omitted.

In a high-tension connector box 1', each flange with a bracket shape 25, 26 is formed integrally with an inner cover 3' and a shielding cover 9'. A bolt 31 of the battery case 30 at the vehicle body is inserted through an opening 27, 29 of each flange 25, 26, and the flanges 25, 26 are fixed together with a nut 32 and the bolt 31.

The flange 25 of the inner cover 3' projects outwardly in a horizontal direction from the bottom end of the one vertical side wall 17. The flange 26 of the shielding cover 9' projects outwardly in a horizontal direction from the bottom end of the one vertical side wall 15 in the inner cover 3'. The flange 25 of the inner cover 3' is arranged at an upper side and the flange 26 of the shielding cover 9' is arranged at an lower side so as to be overlapped each other.

The flange 26 of the shielding cover 9' contacts with a bottom wall of the battery case 30, made of steel plate and under the shield case 9', of the vehicle body (not shown). The bolt 31 is fixed on the battery case 30. The bolt 31 is inserted through each hole 28, 27 of the flange 26 of the shielding cover 9' and of the flange 25 of the inner cover 3' to be fixed with a nut 32. Thereby, the flange 26 of the shielding cover 9' is pressed to the battery case 30 by the flange 25 of the inner cover 3'. Thus, the inner cover 3' and the shielding cover 9' are fixed together, and the shielding cover 9' is grounded securely through the battery case 30 to the vehicle body, so that the shielding cover can perform good electromagnetic shielding effect. Noise generated at the high-tension circuit 7, 34 and the relay 5 in the upper side is absorbed by the shielding cover 9' and flows securely through the battery case 30 to the vehicle body.

When the relay 5 is mounted, and the bus-bar circuit board 6 and the inner cover 3' are pushed strongly downwardly, the metallic shielding cover 9' can securely receive a pushing force, and support securely the bus-bar circuit board 6 and the inner cover 3'. Thereby, The manufacturability of mounting the relay 5 can be improved, and the deformation of the bus-bar circuit board 6, the inner cover 3' and the bus bar 7 on the top surface of the inner cover 3' is securely prevented. In the embodiment of FIG. 1, the same thing can be said.

In FIG. 2, the top cover 2, the tab terminal 11 of the relay 5, the junction terminal 12, tab terminals 22, 23 of each bus bar, the controller 10 and the bottom cover 4 fixed on the shielding cover 9' are shown.

FIGS. 3, 4 show the above high-tension connector box in detail. The same components in FIGS. 1, 2 are put with the same marking for explanation.

In FIG. 3, the relay 5, the top cover 2 made of synthetic resin, the bus-bar circuit board 6, the inner cover 3' made of synthetic resin, the bus bar 7 made of a conductive metal wired on the inner cover 3', the shielding cover 9' made of the conductive metal, the bottom cover 4 made of synthetic resin, the controller 10 such as an ECU arranged on the bottom cover 4, and the control baseboard 61 formed with the circuit baseboard on the bottom cover and the controller 10 are shown.

The tab terminal 11 of the relay 5 is inserted into the slit-like hole 21 of the top wall 19 of the top cover 2 and connected through the junction terminal 12 with the tab terminal 22 of the bus bar 34 thereunder and the tab terminal 23 of the bus bar 7 on the inner cover 3'.

In this embodiment, each relay 5 has four tab terminals 11. The bus bar 34 of the bus-bar circuit board 6 has two or three tab terminals 22 for the relay 5. The bus bar 7 close to the inner cover 3' has one or two tab terminals 23. The tab terminals 23 close to the inner cover 3' are inserted through slit-like holes (not shown) of the insulation board 35 of the bus-bar circuit board 6 and arranged together with the tab terminals 22 of the bus-bar circuit board 6.

A vertical bus bar portion 36 of a wide bus bar 34 of the bus-bar circuit board 6 is continued to a terminal block 37 of a negative pole at the inner cover 3' and a vertical bus bar portion 38 of the bus bar 7 at the inner cover 3' is continued to a terminal block 39 of a positive pole, and both bus bars are connected respectively to a common negative pole and a common positive pole (not shown) of a circuit (electric wire) at an inverter. A horizontal terminal 41 of a thin bus bar 40 of a negative pole of the bus-bar circuit board 6 and a terminal 42 of a positive pole at the inner cover 3' are located in a connector housing 43 at the bottom cover 4 so as to form a connector. The terminal 42 of a positive pole is connected with a low current fuse 44 at the inner cover 3' and the low current fuse 44 is connected to the bus bar 7.

Each bus bar 7, 34 has a terminal (not shown) provided in each of two connector housings 45 at the top cover 2. These two connectors are connected with the common positive and negative pole circuit (not shown) at the battery. The inner cover 3' is provided with a current sensor 46 and a high-current fuse 47. The top cover 2 is provided with a manual circuit breaker 48.

The inner cover 3' has a horizontal top wall 13, vertical front/rear and left/right side walls 17, 49 and an opening 18 at lower side. The front side wall 49 has an opening 51 to engage a connector housing 50 at the bottom cover 4. A front/rear pair of bracket-like flanges 25 projects outwardly at bottom ends of the side walls 17. A bottom surface 25a of the flange 25 is located slightly upper than a low end 17a of the side wall 17. The flange 25 is provided with a hole 27 for inserting a vertical bolt.

The shielding cover 9' has a horizontal top wall 14, vertical right/left side walls 15 and a bracket-like flange 26 projecting outwardly from a bottom end of one side wall 15. The top wall 14 and one side wall 15 are provided with an opening 52 for inserting a high-current fuse 47, a hole 54 to escape a top end of a bolt 53 for connecting the low-current fuse 44 and bus bar 7, a lock hole 56 for engaging a flexible lock hook 55 of the inner cover 3' and a hole for inserting a connector 43 at the inner cover 3'.

The shielding cover 9' has a large opening 57 for arranging a plurality of connectors 50 at the inner cover 3'. When there is no connector, the shielding cover 9' can have a vertical side wall at rear side thereof. The flanges 26 project perpendicularly from front and rear ends of the one side wall 15 corresponding to the flanges 25 of the inner cover 3'. The flange 26 has a hole 28 coaxial with the hole 27 of the flange 26 of the inner cover 3'. The shielding cover 9' is formed easily into U-shape by folding one sheet of steel plate.

The bottom cover 4 has a horizontal insulation bottom wall (insulation baseboard) 58 and low side walls 59, 60 standing from front/rear and right/left edges of the bottom wall 58. Flexible lock hooks 55 are respectively projecting along the right/left side walls 59. The connector housings 50, 43 are arranged above upper ends of the front and left side walls 60, 59. Each connector housing 50, 43 are fixed on the bottom wall 58. Terminals (not shown) are received in the connector housings 50, 43. The terminals are connected with a circuit (not shown) such as the printed circuit board on the bottom wall 58. The circuit is connected with the controller 10. The controller 10 and the circuit board (not shown) form the control baseboard 61.

Each component shown in FIG. 3 are assembled as shown in FIG. 4 so as to form the high-tension connector box 1'. The shielding cover 9' is arranged above the bottom cover 4. The shielding cover 9' covers the control baseboard 61 including the controller 10. The inner cover 3' is arranged above the shielding cover 9' so that the inner cover 3' covers the shielding cover 9'. The bus-bar circuit board 6 is stacked on the inner cover 3'. The top cover 2 covers the bus-bar circuit board 6 and the inner cover 3'. The relay 5 is mounted on the top cover 2.

The flange 26 of the shielding cover 9' is arranged under the flange 25 of the inner cover 3' so as to stack on each other. The same bolt is inserted through the holes 27, 28 of the flanges 25, 26 and the flanges 25, 26 are fixed together on the conductive metallic battery case of the vehicle body. The vertical side walls 17, 49 of the inner cover 3' are positioned along outer surfaces of the side walls 59, 60 of the bottom cover 4. Bottom ends of the vertical side walls 17, 49 abut on a flange 58a at an outer edge of a bottom wall of the bottom cover 4.

The high-tension circuit structured by the bus bar 34 of the bus-bar circuit board 6 and the bus bar 7 at the inner cover 3' are isolated by the inner cover 3' made of synthetic resin. Thereby, heat effect of the high-tension circuit and the contact point of relay 5 thereon is insulated by the inner cover 3' so as to be transferred hardly to the controller 10, so that malfunction of the controller 10 can be prevented.

The control baseboard 61 including the controller 10 is covered by the shielding cover 9'. Thereby, noise of the relay 5 is insulated and the noise flows securely from the shielding cover 9' through the flange 26 to the vehicle body. The inner cover 3' and the shielding cover 9' can be fixed simultaneously to each other with the same bolt, so that manufacturability of assembling the high-tension connector box 1' is improved.

When the relay 5 is strongly pushed downwardly for mounting the relay 5, the shielding cover 9' can securely support a pushing force. Thereby, deformation and breakage of the inner cover 3', the bus-bar circuit board 6 and the top cover 2 are securely prevented. The manufacturability of mounting the relay 5, that is inserting the tab terminal 11 of the relay 5 into the junction terminal 12, can be improved.

The high-tension circuit is completely covered at an upper side, front/rear sides and right/left sides by the top cover 2. The control baseboard 61 including the controller 10 is covered triply with the shielding cover 9', the inner cover 3' and the top cover 2. Thereby, waterproofness of the high-tension connector box 1 is improved.

Instead of the relay, a box-shape high-current fusible link can be mounted on the top cover 2.

It is further understood by those skilled in the art that the foregoing description is a preferred embodiment of the disclosed device and that various changes and modifications may be made in the invention without departing from the spirit and scope thereof.

What is claimed is:

1. A high-tension connector box, comprising:
    a top cover;
    a bottom cover;
    an inner cover being provided between the top cover and the bottom cover, the inner cover having an upper horizontal wall and downward vertical walls providing an opening;
    an electric component being mounted on the top cover:
    a high-tension circuit being interposed between the top cover and the inner cover; and
    a control baseboard unit being provided at the bottom cover,
    wherein the inner cover covers the bottom cover, with the bottom cover disposed within the opening of the inner cover, and the control baseboard unit is protected by the inner cover from being heated by the electric component and the high-tension circuit.

2. The high-tension connector box according to claim 1, further comprising:
    a shielding cover, made of conductive metal, being provided between said bottom cover and said inner cover,
    wherein the inner cover and the shielding cover respectively have a flange, and are fixed simultaneously on to a vehicle body with a bolt by overlapping said flanges.

3. The high-tension connector box according to claim 1, further comprising:
    a bus-bar circuit board including said high-tension circuit covering an upper side of the inner cover.

4. The high-tension connector box according to claim 3, wherein the inner cover and the shielding cover respectively have a flange, and are fixed simultaneously on to a vehicle body with a bolt by overlapping said flanges.

5. The high-tension connector box according to claim 1, further comprising:
    a shielding cover, made of conductive metal, being provided between said bottom cover and said inner cover,
    wherein said shielding cover is disposed within the opening of the inner cover and covers the bottom cover for protecting the control baseboard unit from electric noise of the electric component and/or the high-tension circuit.

6. The high-tension connector box according to claim 5, wherein the inner cover and the shielding cover respectively have a flange, and are fixed simultaneously on to a vehicle body with a bolt by overlapping said flanges.

7. The high-tension connector box according to claim 5, further comprising:
   a bus-bar circuit board including said high-tension circuit covering an upper side of the inner cover.

8. The high-tension connector box according to claim 7, wherein the inner cover and the shielding cover respectively have a flange, and are fixed simultaneously on to a vehicle body with a bolt by overlapping said flanges.

9. The high-tension connector box according to claim 1, wherein a space for receiving a junction terminal to connect said electric component with said high-tension circuit is provided between the top cover and the high-tension circuit.

10. The high-tension connector box according to claim 9, wherein the inner cover and the shielding cover respectively have a flange, and are fixed simultaneously on to a vehicle body with a bolt by overlapping said flanges.

11. The high-tension connector box according to claim 9, further comprising:
   a bus-bar circuit board including said high-tension circuit covering an upper side of the inner cover.

12. The high-tension connector box according to claim 11, wherein the inner cover and the shielding cover respectively have a flange, and are fixed simultaneously on to a vehicle body with a bolt by overlapping said flanges.

13. The high-tension connector box according to claim 9, further comprising:
   a shielding cover, made of conductive metal, being provided between said bottom cover and said inner cover,
   wherein said shielding cover covers the bottom cover for protecting the control baseboard unit from electric noise of the electric component and/or the high-tension circuit.

14. The high-tension connector box according to claim 13, wherein the inner cover and the shielding cover respectively have a flange, and are fixed simultaneously on to a vehicle body with a bolt by overlapping said flanges.

15. The high-tension connector box according to claim 13, further comprising:
   a bus-bar circuit board including said high-tension circuit covering an upper side of the inner cover.

16. The high-tension connector box according to claim 15, wherein the inner cover and the shielding cover respectively have a flange, and are fixed simultaneously on to a vehicle body with a bolt by overlapping said flanges.

* * * * *